(12) United States Patent
Lee et al.

(10) Patent No.: US 9,123,447 B2
(45) Date of Patent: Sep. 1, 2015

(54) MEMORY, MEMORY SYSTEM INCLUDING THE SAME AND METHOD FOR OPERATING MEMORY

(71) Applicant: SK hynix Inc., Gyeonggi-do (KR)

(72) Inventors: Yo-Sep Lee, Gyeonggi-do (KR);
Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 76 days.

(21) Appl. No.: 14/109,582

(22) Filed: Dec. 17, 2013

(65) Prior Publication Data
US 2015/0043292 A1  Feb. 12, 2015

(30) Foreign Application Priority Data
Aug. 9, 2013  (KR) .......... 10-2013-0094759

(51) Int. Cl.
*G11C 29/00* (2006.01)
*G11C 29/50* (2006.01)
*G11C 29/02* (2006.01)
*G11C 29/08* (2006.01)
*G11C 29/12* (2006.01)

(52) U.S. Cl.
CPC ........ *G11C 29/50012* (2013.01); *G11C 29/025* (2013.01); *G11C 29/08* (2013.01); *G11C 2029/1202* (2013.01); *G11C 2029/5002* (2013.01)

(58) Field of Classification Search
CPC ............ G11C 29/50012; G11C 29/08; G11C 29/025; G11C 2029/1202; G11C 2029/5002
USPC ........ 365/201, 149, 203, 222, 185.02, 185.09
See application file for complete search history.

(56) References Cited

U.S. PATENT DOCUMENTS

| | | | |
|---|---|---|---|
| 5,299,168 A * | 3/1994 | Kang ............................. | 365/222 |
| 5,410,507 A * | 4/1995 | Tazunoki et al. ......... | 365/189.09 |
| 5,502,677 A * | 3/1996 | Takahashi ..................... | 365/201 |
| 6,614,704 B2 * | 9/2003 | Dobler et al. ................. | 365/222 |
| 6,940,774 B2 * | 9/2005 | Perner ........................... | 365/222 |
| 7,373,564 B2 * | 5/2008 | Kikutake et al. .............. | 714/718 |

FOREIGN PATENT DOCUMENTS

| | | |
|---|---|---|
| KR | 1020100115551 | 10/2010 |
| KR | 1020140029018 | 3/2014 |

* cited by examiner

*Primary Examiner* — Tan T. Nguyen
(74) *Attorney, Agent, or Firm* — IP & T Group LLP

(57) ABSTRACT

A memory may include a plurality of word lines to which one or more memory cells are connected, and a control unit suitable for activating and precharging a first word line that is selected based on an address of a high-activated word line during a target refresh operation while sequentially activating and precharging the plurality of word lines in a refresh operation, wherein the control unit is suitable for writing a test data to one or more first memory cells connected to the first word line during the target refresh operation in a test mode, wherein the high-activated word line is a word line activated over a reference number or a reference frequency, among the plurality of word lines.

21 Claims, 7 Drawing Sheets

MEMORY, MEMORY SYSTEM INCLUDING THE SAME AND METHOD FOR OPERATING MEMORY

CROSS-REFERENCE TO RELATED APPLICATIONS

The present application claims priority of Korean Patent Application No. 10-2013-0094759, filed on Aug. 9, 2013, which is incorporated herein by reference in its entirety.

BACKGROUND

1. Field

Exemplary embodiments of the present invention relate to a memory, a memory system and a method for operating the memory.

2. Description of the Related Art

A memory cell of a memory comprises a transistor for serving as a switch and a capacitor for storing charge (data). Data is identified as HIGH (logic 1) or Low (logic 0) depending on whether or not data is stored in the capacitor, that is, whether voltage level of the capacitor is high or low.

Ideally, there is no power consumption in retaining data in the memory cell because data is stored in the form of accumulation of charge in the memory cell. However, there is a leakage current due to PN junction of a MOS transistor, which leads to loss of charge accumulated in the capacitor and loss of data stored in the memory cell. To prevent the loss of data, the memory cell may be recharged by reading its data before the data is lost. Such an operation of reading and recharging is to be performed repeatedly for secure data storage of the memory cell. The operation is referred to as a refresh operation.

The refresh operation may be performed in response to a refresh command inputted from a memory controller to the memory. The memory controller generates the refresh command every predetermined time in consideration of data retention time of the memory. For example, the memory controller generates 8,000 refresh commands for 64 ms when the data retention time is 64 ms and all of the memory cells in the memory are refreshed with 8,000 refresh commands.

A space between word lines is getting shorter and coupling effect between adjacent word lines is becoming a concern as degree of memory integration is getting higher. Therefore, when a specific word line in the memory is activated frequently or too many times for the refresh operations, data of a memory cell connected to a word line adjacent to the specific word line may be damaged.

FIG. 1 is a diagram of a part of a cell array in a memory illustrating word line disturbance effect. Referring to FIG. 1, the cell array may include bit lines BL and 3 word lines WLK−1, WLK, and WLK+1 disposed adjacently.

The word line WLK marked with HIGH_ACT is activated with high frequency. The word lines WLK−1 and WLK+1 are adjacent to the word line WLK. Memory cells CELL_K−1, CELL_K and CELLK+1 are connected to the word lines WLK−1, WLK and WLK+1, respectively. The memory cells CELL_K−1, CELL_K and CELL_K+1 comprise cell transistors TR_K−1, TR_K and TR_K+1 and cell capacitors CAP_K−1, CAP_K and CAP_K+1, respectively.

When the word line WLK is activated or precharged (deactivated), voltage levels of the word lines WLK−1 and WLK+1 rise or fall and charge stored in the cell capacitors CAP_K−1 and CAP_K+1 of the word lines WLK−1 and WLK+1 is affected due to coupling effects between the word lines WLK−1 and WLK and between the word lines WLK and WLK+1. Change in the charge stored in the cell capacitors CAP_K−1 and CAP_K+1 of the word lines WLK−1 and WLK+1 may cause loss of data stored therein when the voltage level of the word line WLK toggles frequently between the activated state and the precharged state as the word line WLK is activated and precharged frequently.

As the voltage level of the word line WLK toggles between the activated state and the precharged state, electro-magnetic wave may be generated to bring about inflow or outflow of electron to or from the cell capacitors CAP_K−1 and CAP_K+1 of the adjacent word lines WLK−1 and WLK+1. Therefore, the data stored in the memory cell may be damaged.

SUMMARY

Exemplary embodiments of the present invention are directed to a memory, a memory system and a method for operating the memory that may test an operation for preventing malfunction caused due to word line disturbance.

Exemplary embodiments are directed to a memory, a memory system and a method for operating the memory that may identify an address of word line at risk of word line disturbance.

In an embodiment, a memory may include a plurality of word lines to which one or more memory cells are connected, and a control unit suitable for activating and precharging a first word line that is selected based on an address of a high-activated word line during a target refresh operation while sequentially activating and precharging the plurality of word lines in a refresh operation, wherein the control unit is suitable for writing a test data to one or more first memory cells connected to the first word line during the target refresh operation in a test mode, wherein the high-activated word line is a word line activated over a reference number or a reference frequency, among the plurality of word lines.

In another embodiment, a memory system may include a memory controller suitable for generating a refresh command with a set interval in a refresh operation and additionally generating write and precharge commands and testing data with the refresh command in a test mode, and a memory including a plurality of word lines to which one or more memory cells are connected and suitable for activating and precharging an adjacent word line that is adjacent to a high-activated word line during a target refresh operation while sequentially activating and precharging the plurality of word lines in response to the refresh command, wherein the memory is suitable for writing the test data to one or more first memory cells connected to the adjacent word line during the target refresh operation in the test mode, wherein the high-activated word line is a word line activated over a reference number a reference frequency, among the plurality of word lines.

In further embodiment, a memory system may include a memory controller suitable for generating an active command and a precharge command sequentially during a target refresh operation and the active command, the precharge command and a write and precharge command sequentially in the test mode, and a memory including a plurality of word lines to which one or more memory cells are connected and suitable for activating and precharging an adjacent word line that is adjacent to a high-activated word line in response to the active command and the precharge command during the target refresh operation, wherein the memory is suitable for writing a test data to a first memory cell connected to the adjacent word line in response to the active command and the write and precharge command during the target refresh operation in a test mode, wherein the high-activated word line is a word line activated over a reference number or a reference frequency, among the plurality of word lines.

In still further embodiment, a method for operating a memory including a plurality of word lines to which one or more memory cells are connected may include setting a mode of the memory to a test mode, detecting a high-activated word line, among the plurality of word lines, which is activated over a reference number or reference frequency to perform a target refresh operation, writing a test data to an adjacent word line that is adjacent to the high-activated word line during a target refresh operation, and reading data written to the memory cells that are connected to the plurality of word lines.

In accordance with the above embodiments, it may be tested whether or not an operation for preventing malfunction caused due to word line disturbance is performed properly. Also an address of word line at risk of word line disturbance may be identified.

DETAILED DESCRIPTION

Figure 1:
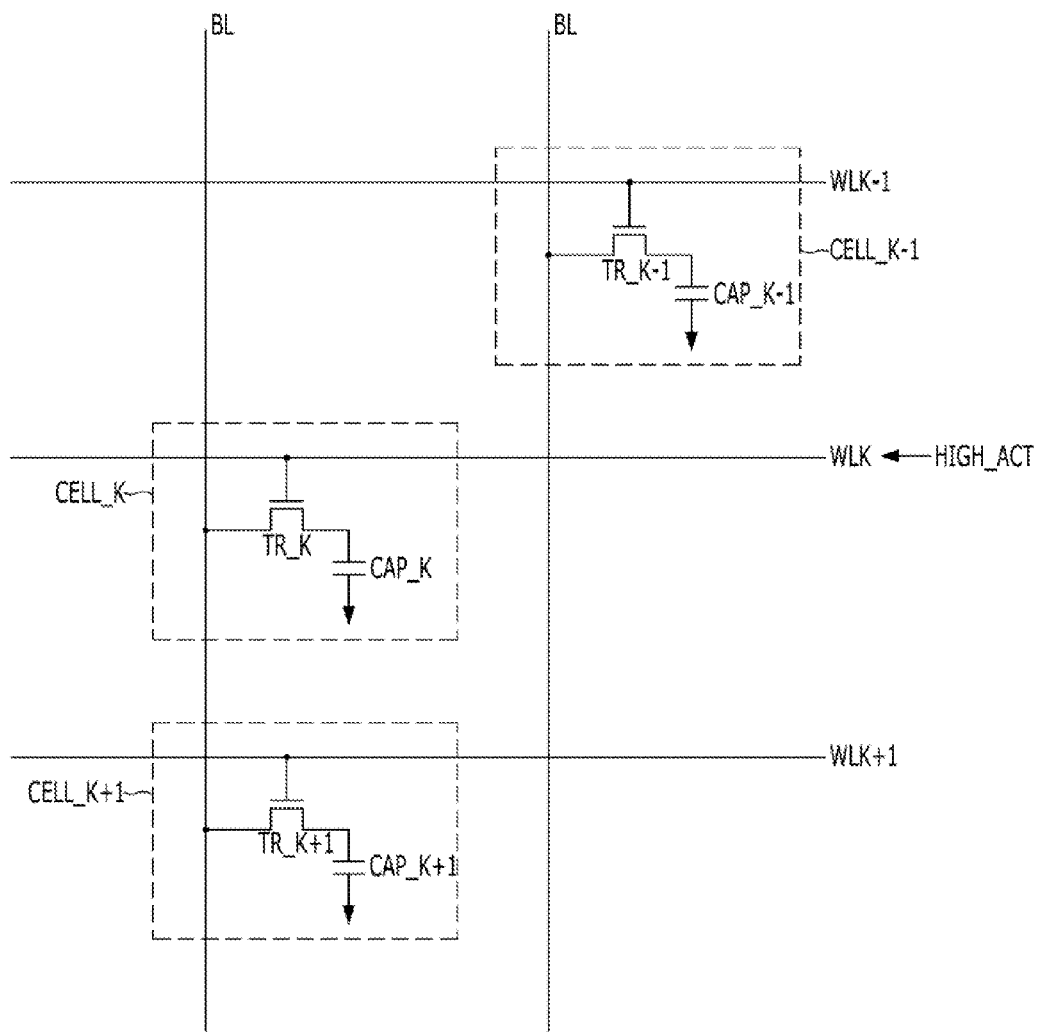
FIG. 1 is a diagram of a part of a cell array in a memory illustrating word line disturbance effect.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. Exemplary embodiments of the present invention are directed to a memory that operates properly even when the memory includes a memory cell having an insufficient data retention time, and a memory system including the memory.

In the description, an adjacent word line is disposed adjacent to a specific word line and data of memory cells connected thereto is affected by toggles of the specific word line between an activated state and a precharged state. A high-activated word line is a word line that is activated over a reference number of times or over a reference frequency, and it may damage data of memory cells that are connected to a word line adjacent thereto. Activating and precharging selected word line in response to a refresh command may represent a refresh operation to the selected word line.

Figure 2:
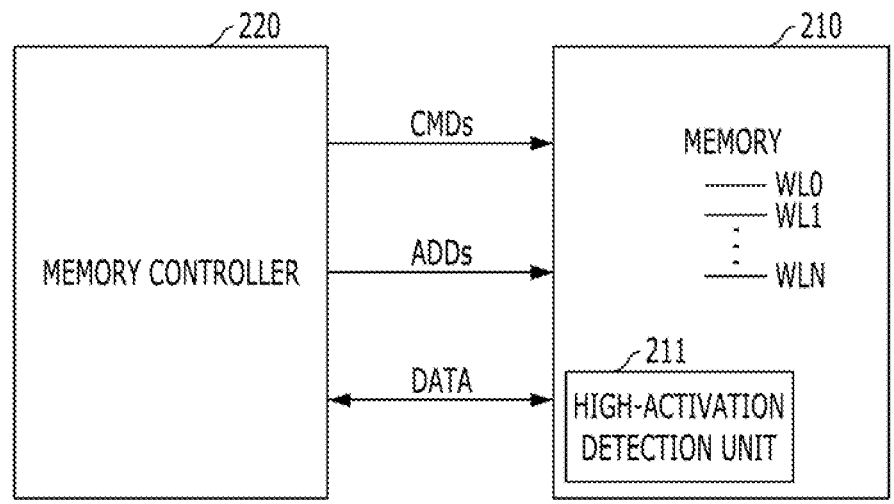
FIG. 2 is a block diagram of a memory system illustrating a target refresh operation.

FIG. 2 is a block diagram of a memory system illustrating a target refresh operation.

Referring to FIG. 2, the memory system may include a memory 210 and a memory controller 220. FIG. 2 shows a memory system where a target refresh operation is performed in the memory 210.

The memory controller 220 controls an operation of the memory 210 by transmitting commands CMDs and addressed ADDs and has data communication with the memory 210 during read operation and write operation. The memory controller 220 inputs an active command, a write command, a read command, a refresh command, a precharge command and so forth to the memory 210 by combining and transmitting the commands CMDs.

When inputting the active command, the memory controller 220 may transmit addresses ADDs (row addresses) to the memory 210 to select a cell array of the memory 210 and a word line to be activated. When inputting the read command or write command, the memory controller 220 may transmit addresses ADDs (column addresses) to the memory 210 to select memory cells to be read from or written to. When inputting the write command, the memory controller 220 may further transmit data DATA to be written to the selected memory cells of the memory 210.

A high-activation detection unit 211 included in the memory 210 may detect a high-activated word line from a plurality of word lines WL0 to WLN and store an address of the high-activated word line. The high-activation detection unit 211 may store an activation history of the plurality of word lines WL0 to WLN and detect a high-activated word line, which meets at least one of conditions that the number of times being activated is over the reference number of times and that the activation frequency is over the reference frequency, in a preset period.

For example, when the reference number of times is $10^6$ and the reference frequency is 2 times per 5 active operations, the high-activation detection unit 211 may count a number of activations of the plurality of word lines WL0 to WLN being activated in the preset period and detect as the high-activated word line a word line, which is activated over $10^6$ times or over 2 times per 5 active operations. The preset period may represent a preset amount of time or a period corresponding to a preset number of active operations. For example, the preset period may be 64 ms (preset amount of time) or may be a period corresponding to $10^8$ active operations (preset number of active operations).

To refresh the plurality of word lines WL0 to WLN, the memory controller 220 may input to the memory 210 a refresh command with a preset interval. The memory 210 may refresh one or more of the plurality of word lines WL0 to WLN whenever receiving the refresh command and, in the preset period, refresh all of the plurality of word lines WL0 to WLN.

When a high-activated word line is detected, the memory 210 may refresh one or more of adjacent word lines in response to the refresh command. If the high-activated word line is Kth word line in the cell array, the adjacent word lines may include (K−1)th word line and (K+1)th word line, which means word lines physically adjacent to the Kth word line. The memory 210 may refresh the plurality of word lines WL0 to WLN sequentially again after refreshing one or more adjacent word lines.

The high-activation detection unit 211 may be included in the memory controller 220, in which case the memory controller 220 may transmit an address of the high-activated word line to the memory 210 when the high-activated word line is detected.

Figure 3:
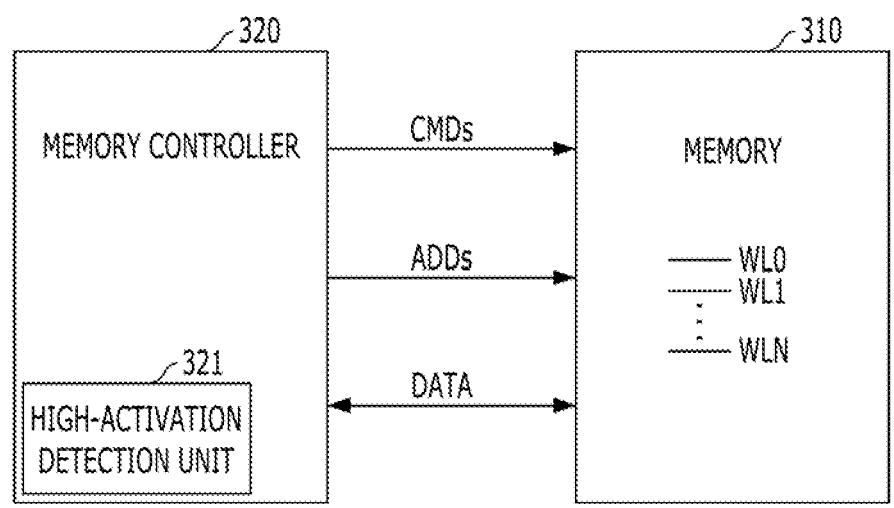
FIG. 3 is a block diagram of a memory system illustrating a target refresh operation as an embodiment.

FIG. 3 is a block diagram of a memory system illustrating a target refresh operation as another embodiment.

Referring to FIG. 3, the memory system may include a memory 310 and a memory controller 320. FIG. 3 shows a memory system where the memory controller 320 inputs a command and an address to the memory 310 for the target refresh operation.

When the high-activated word line is detected by the high-activation detection unit 321, the memory controller 320 may input commands CMDs and addresses ADDs to the memory 310 for entering into a target refresh operation. When the memory 310 enters into the target refresh operation, the memory controller 320 may input the active command and the precharge command by turns and input an address for selection of an adjacent word line with the active command.

When the memory 310 enters into the target refresh operation, the memory 310 may refresh one or more adjacent word lines, that is, activate and precharge one or more adjacent word lines, in response to the active command and the precharge command.

The high-activation detection unit 321 may be included in the memory 310. In such case the memory 310 may transmit an address of the high-activated word line to the memory controller 320 when the high-activated word line is detected.

As described above, the target refresh operation may be performed in the memory system with various ways. The memory system may further perform a test operation to know whether or not the target refresh operation is properly performed and to which word line the target refresh operation is performed.

Figure 4:
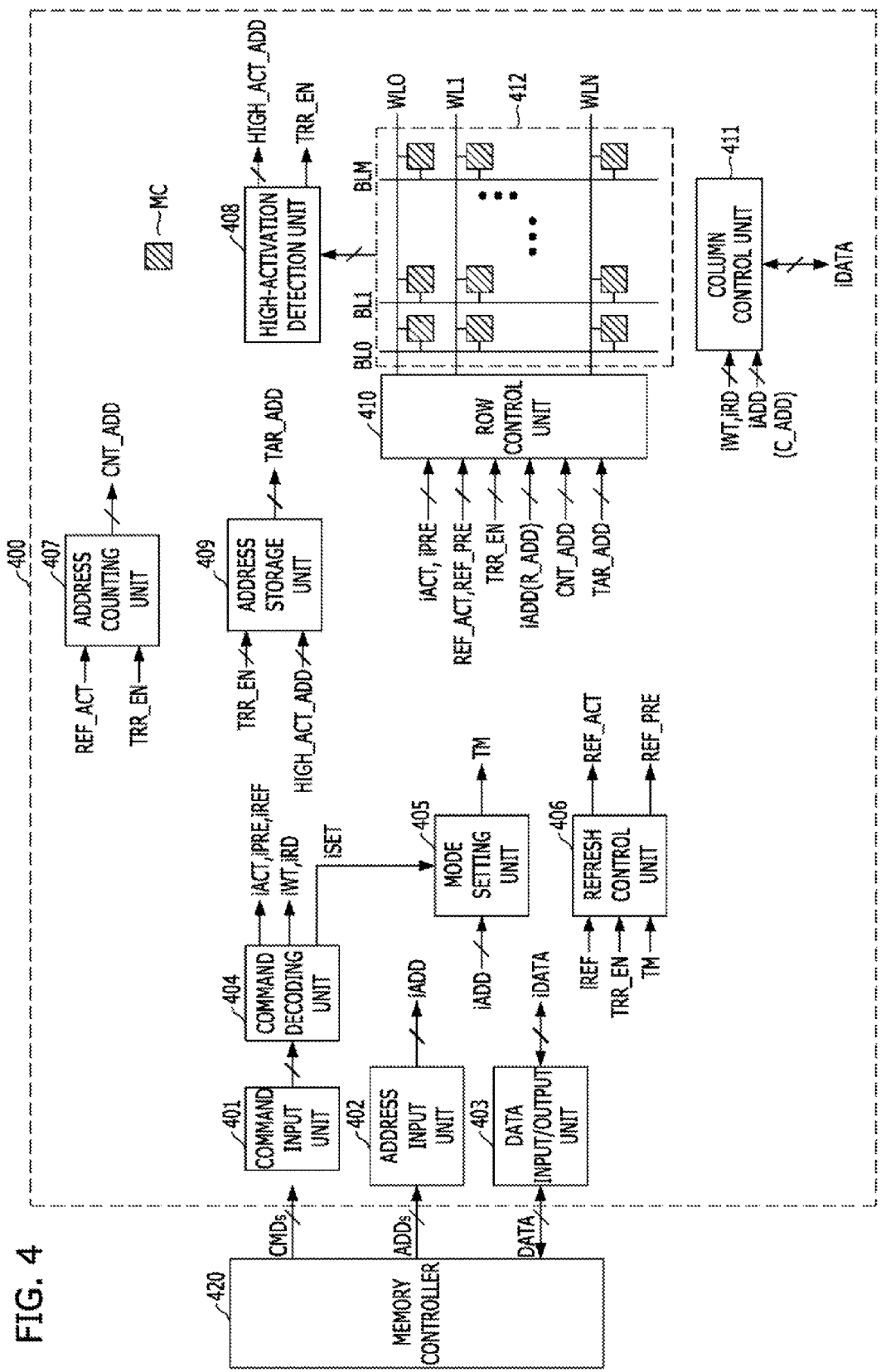
FIG. 4 is block diagram illustrating a memory system in accordance with an embodiment of the present invention.

FIG. 4 is block diagram illustrating a memory system in accordance with an embodiment of the present invention.

Referring to FIG. 4, the memory system may include a memory 400 and a memory controller 420. The memory 400 may include a command input unit 401, an address input unit 402, a data input/output unit 403, a command decoding unit 404, a mode setting unit 405, a refresh control unit 406, an address counting unit 407, a high-activation detection unit 408, an address storage unit 409, a row control unit 410, a column control unit 411, and a cell array 412. FIG. 4 shows a memory system where a target refresh operation is performed in the memory 400.

The memory system is described with reference to FIG. 4.

The memory 400 may perform a refresh operation in response to a deactivated target refresh signal TRR_EN and a target refresh operation in response to an activated target refresh signal TRR_EN.

The cell array 412 may include a plurality of word lines WL0 to WLN, a plurality of bit lines BL0 to BNM and a plurality of memory cells MC connected to the plurality of word lines WL0 to WLN and the bit lines BL0 to BLM.

The command input unit 401 may receive commands CMDs from the memory controller 420. The address input unit 402 may receive addressed ADDs from the memory controller 420. The data input/output unit 403 may receive data DATA from the memory controller 420 and transmit data DATA output from the memory 400. Each of the commands CMDs, the addresses ADDs, and data DATA may include multi-bit signals.

The command decoding unit 404 may decode commands CMDs input from the command input unit 401 to generate an active command iACT, a write command iWT, a read command iRD, a precharge command iPRE, a refresh command iREF and a mode setting command iSET. The command decoding unit 404 may activate one of the commands iACT, iWT, iRD, iPRE, iREF and iSET depending on the combination of the commands CMDs. The mode setting command iSET may be a MRS command for setting a mode register set MRS.

When the mode setting command iSET is activated, the mode setting unit 405 may activate or deactivate a test mode signal TM representing a test mode in response to the address iADD input from the address input unit 402. The test mode signal TM is activated when the test mode is set and deactivated when the test mode is not set.

The high-activation detection unit 408 may detect a high-activated word line by referring to activation histories of the plurality of word lines WL0 to WLN and activate the target refresh signal TRR_EN when the high-activated word line is detected. The high-activation detection unit 408 may deactivate the target refresh signal TRR_EN when completing refresh operations to one or more of word lines adjacent to the high-activated word line. The description illustrates as an example refresh operations performed to 2 adjacent word lines in the target refresh operation. That is, the high-activation detection unit 408 may activate the target refresh signal TRR_EN and then deactivate it after a refresh precharge signal REF_PRE is activated twice. If the high-activated word line is kth word line in the cell array 412, the adjacent word lines may include (k−1)th word line and (K+1)th word line. The high-activation detection unit 408 may input to the address storage unit 409 an address HIGH_ACT_ADD of the high-activated word line when the high-activated word line is detected.

The activation history may represent the total number of activations of the plurality of word lines WL0 to WLN for a preset amount of time or the number of activations of the word lines WL0 to WLN for a period corresponding to a preset number of active operations (i.e., the activation frequency). The high-activation detection unit 408 may compare a reference number of times and the number of activations or compare a reference frequency and the activation frequency and detect a high-activated word line, which meets at least one of conditions that the number of activations is over the reference number of times and that the activation frequency is over the reference frequency, in the preset period.

The refresh control unit 406 may activate a refresh active signal REF_ACT and, after preset amount of time, a refresh precharge signal REF_PRE in response to the refresh command iREF.

In case of activated states of the test mode signal TM and the target refresh signal TRR_EN, the refresh control unit 406 may activate the refresh active signal REF_ACT in response to the refresh command iREF but may not activate the refresh precharge signal REF_PRE.

The refresh control unit 406 may activate the refresh active signal REF_ACT and the refresh precharge signal REF_PRE as many times as the number of word lines that are refreshed in response to one refresh command iREF.

Set forth below is the description that the refresh control unit 406 refreshes one word line in response to one refresh command iREF during the refresh operation and the target refresh operation.

The address counting unit 407 may perform counting operations more than one time in every refresh operation and generate a counting address CNT_ADD for selecting one of the plurality of word lines WL0 to WLN during the refresh operation. The address counting unit 407 may change the counting address CNT_ADD whenever one word line is refreshed.

The address counting unit 407 may increase the value of the counting address CNT_ADD by 1 whenever the refresh active signal REF_ACT is activated. Increasing the value of the counting address CNT_ADD by 1 means changing the counting address CNT_ADD to select (k+1)th word line next time when kth word line is selected now. The address counting unit 407 may not perform the counting operation when the target refresh signal TRR_EN is activated.

The address storage unit 409 may store the address HIGH_ACT_ADD of the high-activated word line from the high-activation detection unit 408 and sequentially output addresses of one or more of the adjacent word lines as a target address TAR_ADD each time the refresh active signal REF_ACT is activated when the target refresh signal TRR_EN is activated.

In case that the high-activated word line is kth word line, the address storage unit 409 may output an address of (k−1)th word line when the refresh active signal REF_ACT is activated first time after activation of the target refresh signal TRR_EN and output an address of (k+1)th word line when the refresh active signal REF_ACT is activated second time. For example, when the address value 'K' represents the address HIGH_ACT_ADD of the high-activated word line, the address storage unit 409 may store the address value 'K', generate the address values 'K−1' and 'K+1' by adding 1 to or subtracting 1 from the stored value 'K', and sequentially output the address values 'K−1' and 'K+1' as the target address TAR_ADD.

When the active command IACT is activated, a word line selected by the input address iADD is activated by the row control unit 410. When the refresh active signal REF_ACT is activated, a word line selected by the counting address CNT_ADD is activated by the row control unit 410. When the target refresh signal TRR_EN and the refresh active signal REF_ACT are activated, a word line selected by the target address TAR_ADD is activated by the row control unit 410.

The row control unit 410 may precharge the activated word line when the precharge command PRE or the refresh precharge signal REF_PRE is activated. The input address iADD input to the row control unit 410 may be a row address R_ADD.

The column control unit 411 may write data iDATA from the data input/output unit 403 to memory cells MC selected by the input address iADD out of memory cells MC connected to the activated word line when the write command iWT is activated. The column control unit 411 may transmit to the data input/output unit 403 data iDATA stored in the memory cells MC selected by the input address iADD out of the memory cells MC connected to the activated word line when the read command iRD is activated. The input address iADD input to the column control unit 411 may be a column address C_ADD.

The memory controller 420 may input to the memory 400 a refresh command REF with a preset interval. The memory controller 420 in the test mode may input to the memory 400 sequentially the refresh command REF, a write command WT and a precharge command PRE. The memory controller 420 in the test mode may input to the memory 400 test data T_DATA with the write command WT.

The memory controller 420 in the test mode may input to the memory 400 the test data T_DATA and comparison data C_DATA that is different from the test data T_DATA before the target refresh operation of the memory 400. The memory 400 may write the comparison data C_DATA to one or more of the memory cells MC connected to the plurality of word lines WL0 to WLN before the target refresh operation.

The memory controller 420 in the test mode may read data from one or more of the memory cells MC connected to the plurality of word lines WL0 to WLN after the memory 400 performs the target refresh operation.

Figure 5:
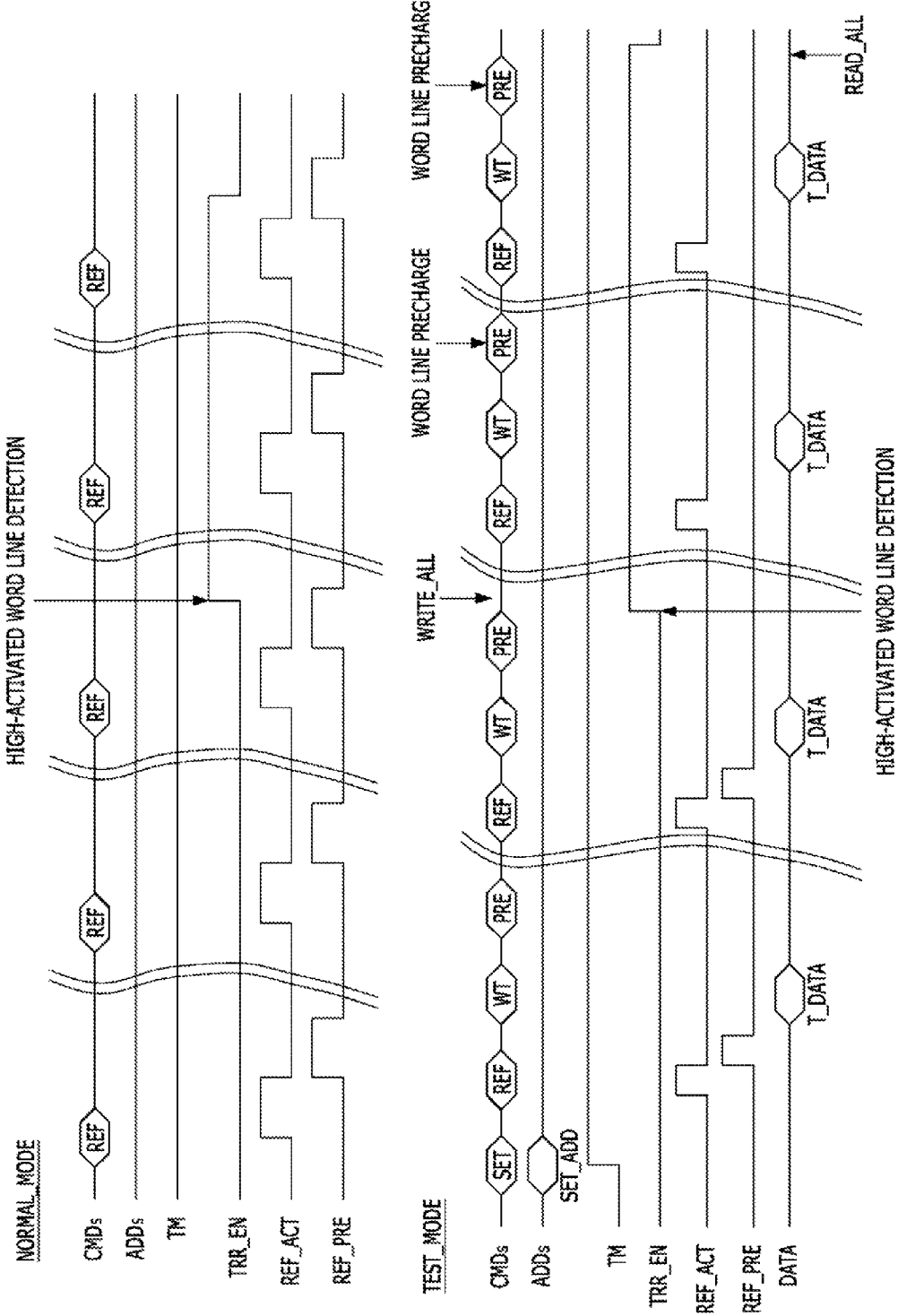
FIG. 5 is a timing diagram illustrating an operation of the memory system shown in FIG. 4.

FIG. 5 is a timing diagram illustrating an operation of the memory system shown in FIG. 4. Overall operation of the memory system is described below with reference to FIGS. 4 and 5.

1. Normal Operation Mode (NORMAL_MODE)

The memory controller 420 may input to the memory 400 the refresh command REF with the preset interval. The memory controller 420 may input to the memory 400 an active command ACT, a write command WT, a read command RD, a precharge command PRE and so forth several times between inputs of the refresh command REF (not illustrated in FIG. 5).

The memory 400 may activate the refresh active signal REF_ACT and the refresh precharge signal REF_PRE and activate and precharge a word line selected by the counting address CNT_ADD in response to the refresh command REF (refresh operation).

When a high-activated word line occurs due to the activation-precharge operations of word lines between the inputs of the refresh command REF, the memory 400 may activate the target refresh signal TRR_EN. While the refresh command REF is input twice, the memory 400 may activate the refresh active signal REF_ACT and the refresh precharge signal REF_PRE and may refresh a word line selected by the target address TAR_ADD (target refresh operation).

2. Test Mode (TEST_MODE)

The memory controller 420 may input to the memory 400 a mode setting command SET and a setting address SET_ADD. The memory 400 may be set in a test mode and the test mode signal TM may be activated in response to the mode setting command SET and the setting address SET_ADD.

The memory controller 420 in the test mode may input to the memory 400 the refresh command REF with the preset interval. The memory controller 420 in the test mode may input to the memory 400 the write command WT and the precharge command PRE after a preset amount of time passes from input of the refresh command REF. The preset amount of time may be a time period tRFC for completing the activation-precharge operation to a word line selected by the refresh operation. The memory controller 420 may input to the memory 400 the test data T_DATA with the write command WT. The test data T_DATA may have preset pattern.

When the write command WT is input during the refresh operation, the test data T_DATA may not be written to a word line which is selected in previous refresh operation, because the word line has been precharged. The memory controller 420 may input to the memory 400 the active command ACT, the write command WT, the read command RD, the precharge command PRE and so forth several times between inputs of the precharge command PRE and the next refresh command REF (not illustrated in FIG. 5).

When a high-activated word line occurs due to the activation-precharge operations of word lines between the inputs of the precharge command PRE and the refresh command REF, the memory 400 may activate the target refresh signal TRR_EN. In case of activated states of the test mode signal TM and the target refresh signal TRR_EN, the memory 400 may activate the refresh active signal REF_ACT in response to the refresh command REF but may not activate the refresh precharge signal REF_PRE. Therefore in the target refresh operation an activated word line may not be precharged until the write command WT is input and the test data T_DATA may be written to one or more of memory cells MC connected to the activated word line. After that, the memory 400 may precharge the activated word line in response to the precharge command PRE.

As described above, in the test mode, the test data T_DATA may be written to the memory cells MC connected to the word line refreshed by the target refresh operation and may not be written to the memory cells MC connected to the word line refreshed by the normal refresh operation.

After completion of all the operations, the memory controller 420 may read all the data of the memory cells MC connected to the plurality of word lines WL0 to WLN of the memory 400. It may be verified whether or not the test data T_DATA is written properly by checking the read data. It may be also checked whether or not the target refresh operation is performed properly and which word line is the high-activated word line.

For easy check of the test data T_DATA, the memory controller 420 in the test mode may write the comparison data C_DATA different from the test data T_DATA to the memory cells MC connected to the plurality of word lines WL0 to WLN of the memory 400 after activation of the target refresh signal TRR_EN. It may be verified whether or not the target refresh operation is performed properly and which word line is the high-activated word line when whole data in the memory 400 is read after completion of the test by the above mentioned operation.

The memory 400 may input to the memory controller 420 the target refresh signal TRR_EN. For example, the test data T_DATA may comprise bits that are all logic HIGH or logic LOW and the comparison data C_DATA may comprise bits of inverse value of the test data T_DATA.

Figure 6:
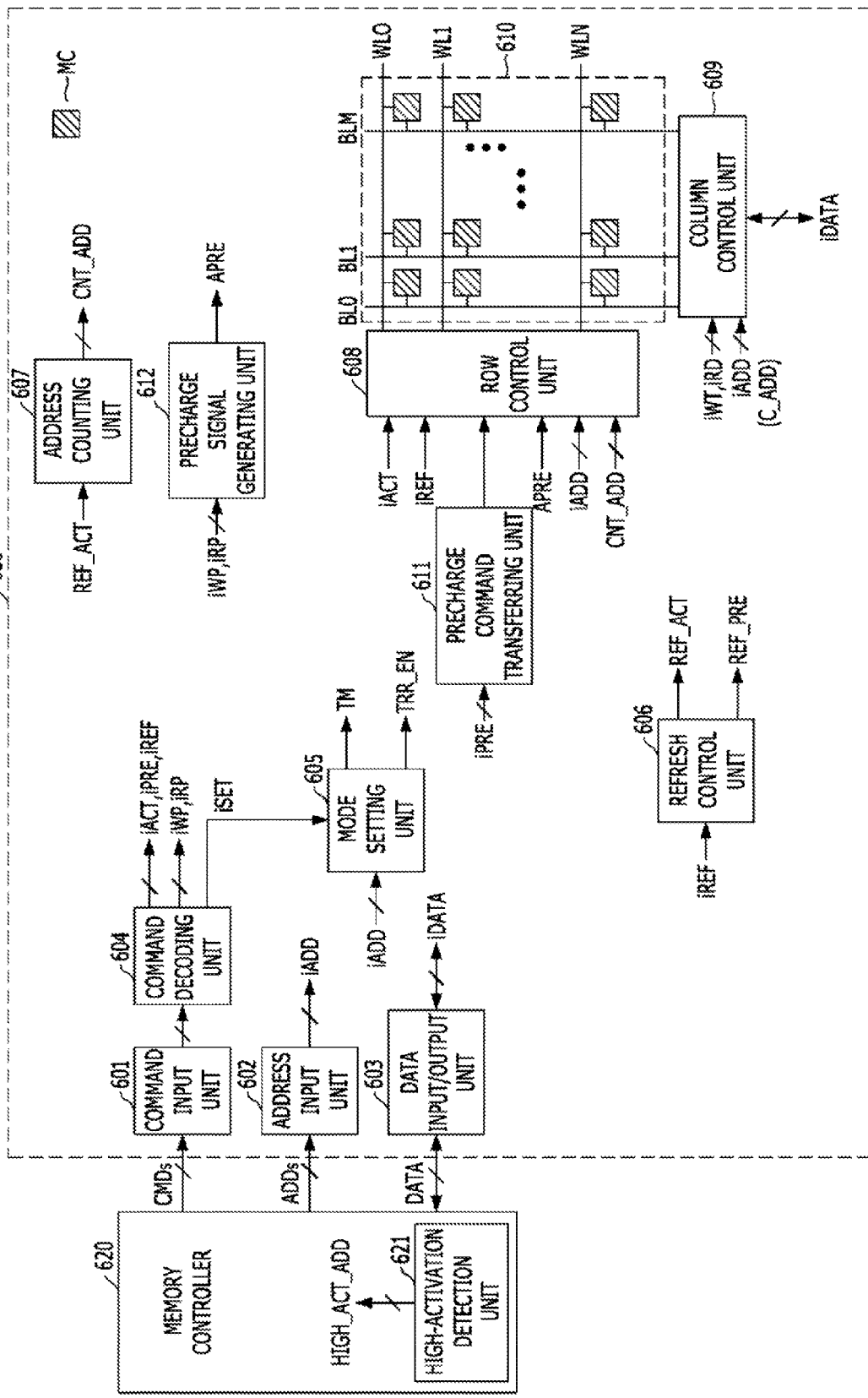
FIG. 6 is block diagram illustrating a memory system in accordance with an embodiment of the present invention.

FIG. 6 is block diagram illustrating a memory system in accordance with another embodiment of the present invention.

Referring to FIG. 6, the memory system may include a memory 600 and a memory controller 620. The memory 600 may include a command input unit 601, an address input unit 602, a data input/output unit 603, a command decoding unit 604, a mode setting unit 605, a refresh control unit 606, an address counting unit 607, a row control unit 608, a column control unit 609, a cell array 610, a precharge command transferring unit 611, and a precharge signal generating unit 612. FIG. 6 shows a memory system where the memory controller 620 inputs a command and an address to the memory 610 for the target refresh operation. The memory controller 620 may include a high-activation detection unit 621.

The memory system is described with reference to FIG. 6.

The memory 600 may perform a normal refresh operation in response to deactivated target refresh signal TRR_EN and activation-precharge operations for a target refresh operation in response to activated target refresh signal TRR_EN.

The cell array 612 may include a plurality of word lines WL0 to WLN, a plurality of bit lines BL0 to BLM and a plurality of memory cells MC connected to the plurality of word lines WL0 to WLN and the bit lines BL0 to BLM.

The command input unit 601 may receive commands CMDs from the memory controller 620. The address input unit 602 may receive addressed ADDs from the memory controller 620. The data input/output unit 603 may receive data DATA from the memory controller 620 and transmit data DATA output from the memory 600. Each of the commands CMDs, the addresses ADDs and data DATA may include multi-bit signals.

The command decoding unit 604 may decode commands CMDs input from the command input unit 601 to generate an active command iACT, a write and precharge command iWP, which is for write operation accompanied by precharge operation, a read and precharge command iRP, which is for read operation accompanied by precharge operation, a precharge command iPRE, a refresh command iREF and a mode setting command iSET. The command decoding unit 604 may activate one of the commands iACT, iWP, iRP, iPRE, iREF and iSET depending on the combination of the commands CMDs. The command decoding unit 604 may generate a normal write command and a normal read command.

When the mode setting command iSET is activated, the mode setting unit 605 may activate or deactivate a test mode signal TM and the target refresh signal TRR_EN representing a target refresh period in response to the address iADD input from the address input unit 602.

The refresh control unit 606 may activate a refresh active signal REF_ACT and, after preset amount of time, may activate a refresh precharge signal REF_PRE in response to the refresh command iREF.

The address counting unit 607 may perform counting operations in every refresh operation and generate a counting address CNT_ADD for selecting one of the plurality of word lines WL0 to WLN during the refresh operation. The address counting unit 407 may increase the value of the counting address CNT_ADD by 1 whenever the refresh active signal REF_ACT is activated.

The precharge command transferring unit 611 in the test mode may block the precharge command iPRE. The precharge command transferring unit 611 may transfer the precharge command iPRE to the row control unit 608 but, when the test mode signal TM and the target refresh signal TRR_EN are activated, may block the precharge command iPRE and may not transfer the precharge command iPRE to the row control unit 608.

The precharge signal generating unit 612 may generate an auto precharge signal APRE when the write and precharge command iWP or the read and precharge command iRP is activated.

When the active command iACT is activated, a word line selected by the input address iADD is activated by the row control unit 608. When the refresh active signal REF_ACT is activated, a word line selected by the counting address CNT_ADD is activated by the row control unit 608. When the precharge command iPRE, the auto refresh signal APRE or the refresh precharge signal REF_PRE is activated, the row control unit 608 may precharge an activated word line. The input address iADD input to the row control unit 608 may be a row address R_ADD.

The column control unit 609 may write data iDATA from the data input/output unit 603 to memory cells MC selected by the input address iADD out of memory cells MC connected to the activated word line when the write and precharge command iWP is activated. The column control unit 609 may transmit to the data input/output unit 603 data iDATA stored in memory cells MC selected by the input address iADD out of memory cells MC connected to the activated word line when the read and precharge command iRP is activated. The input address iADD input to the column control unit 609 may be a column address C_ADD.

The high-activation detection unit 621 may work like the high-activation detection unit 408 described with reference to FIG. 4. The high-activation detection unit 621 may detect a high-activated word line by referring to activation histories of the plurality of word lines WL0 to WLN and activate the target refresh signal TRR_EN when the high-activated word line is detected. The high-activation detection unit 621 may deactivate the target refresh signal TRR_EN when completing refresh operations to one or more of word lines adjacent to the high-activated word line. The description illustrates as an example refresh operations performed to 2 adjacent word lines in the target refresh operation. That is, the high-activation detection unit 621 may activate the target refresh signal TRR_EN and then deactivate it after a refresh precharge signal REF_PRE is activated twice. If the high-activated word line is kth word line in the cell array 412, the adjacent word lines may include (k−1)th word line and (K+1)th word line. The high-activation detection unit 621 may generate an address HIGH_ACT_ADD of the high-activated word line when the high-activated word line is detected.

The memory controller 620 may input to the memory 400 an active command ACT, the write and precharge command WP or the read and precharge command RP sequentially several times. The memory controller 620, during the target refresh operation, may input to the memory 600 a mode setting command SET and a setting address SET_ADD, set a mode of the memory 600 to the target refresh operation, and input to the memory 600 the active command ACT and a precharge command PRE sequentially twice, at which the memory controller 620 may input to the memory 600 an address for selecting a word line adjacent to the high-activated word line with the active command ACT.

The memory controller 620 in the test mode may input to the memory 600 sequentially the active command ACT, the precharge command PRE and the write and precharge command WP several times. The memory controller 620 may input to the memory 600 test data T_DATA with the write and precharge command WP.

The memory controller 620 in the test mode may read data from one or more of the memory cells MC connected to the plurality of word lines WL0 to WLN after the memory 600 performs the target refresh operation.

Figure 7:
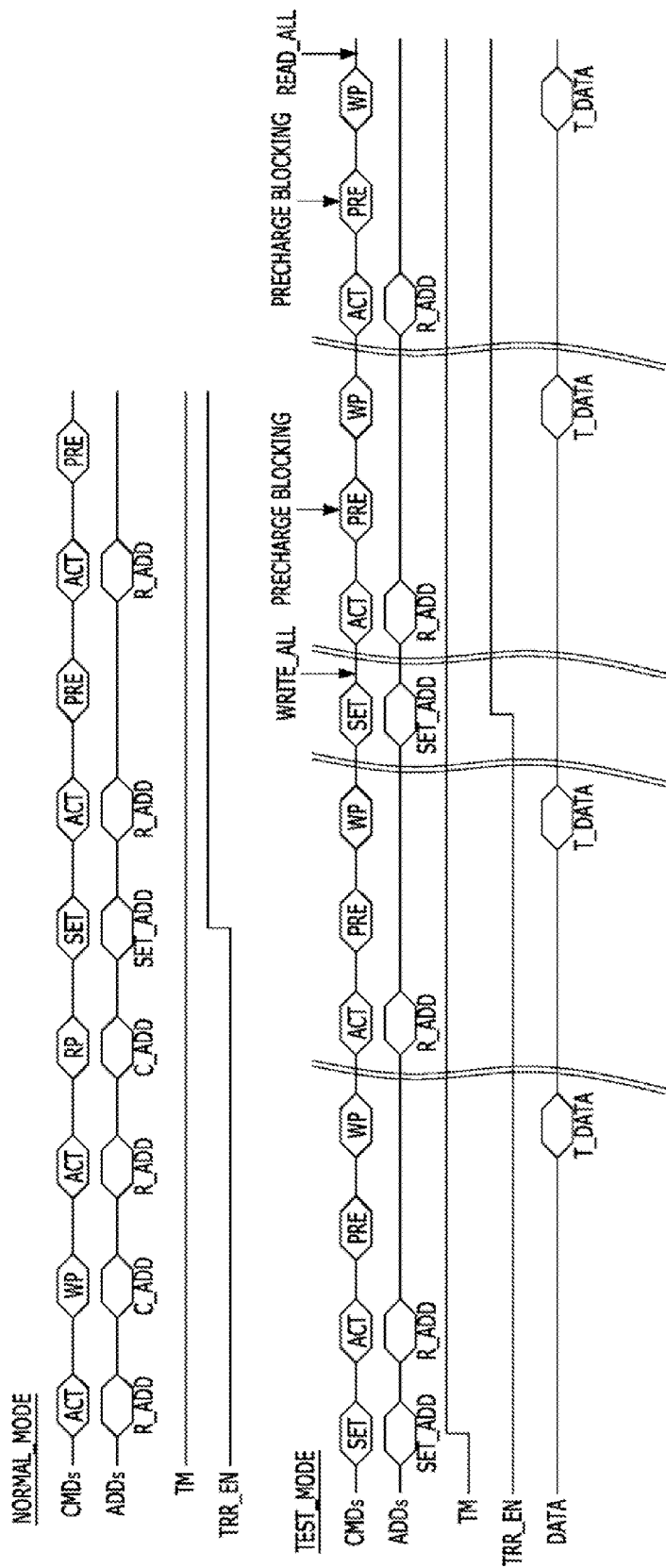
FIG. 7 is a timing diagram illustrating an operation of the memory system shown in FIG. 6.

FIG. 7 is a timing diagram illustrating an operation of the memory system shown in FIG. 6. Overall operation of the memory system is described below with reference to FIGS. 6 and 7.

1. Normal Operation Mode (NORMAL_MODE)

The memory controller 620 may input to the memory 600 sequentially the active command ACT, the write and precharge command WP and the read and precharge command RP several times.

The memory 600 may activate a word line selected by the input address iADD in response to the active command ACT. The memory 600 may write/read data to/from the memory cells MC selected by the input address iADD out of the memory cells MC connected to the activated word line in response to the write and precharge command WP/the read and precharge command RP and, after preset amount of time, may precharge the activated word line.

When a high-activated word line occurs due to the activation-precharge operations of word lines, the memory controller 620 may set the mode of the memory 400 to the target refresh operation and input to the memory 600 sequentially the active command ACT and the precharge command PRE twice, at which the memory controller 620 may input to the memory 600 addresses corresponding 2 adjacent word lines with the active command ACT. The memory 600 may refresh the adjacent word lines in response to the active command ACT and the precharge command PRE.

2. Test Mode (TEST_MODE)

The memory controller 620 may input to the memory 600 the mode setting command SET and a setting address SET_ADD. The memory 600 may be set in a test mode and the test mode signal TM may be activated in response to the mode setting command SET and the setting address SET_ADD.

The memory controller 620 in the test mode may input to the memory 600 sequentially the active command ACT, the precharge command PRE and the write and precharge command WP several times. The memory controller 620 may input to the memory 600 the test data T_DATA with the write and precharge command WP.

Except for the target refresh operation, when the write and precharge command WP is input after inputs of the active command ACT and the precharge command PRE, the test data T_DATA may not be written to a word line, which is selected in previous active operation, because the word line has been precharged. The memory controller 620 may input to the memory 600 the active command ACT, the write and precharge command WP, the read and precharge command RP and so forth several times between inputs of the write and precharge command WP and the next active command ACT (not illustrated in FIG. 7).

When a high-activated word line occurs due to the activation-precharge operations of word lines between the inputs of the write and precharge command WP and the active command ACT, the memory controller 620 may allow the memory 600 to activate the target refresh signal TRR_EN. In case of activated states of the test mode signal TM and the target refresh signal TRR_EN, the memory 600 may block the precharge command PRE that is input after input of the active command ACT and may not perform the precharge operation. Therefore in the target refresh operation an activated word line may not be precharged until the write and precharge command WP is input. The activated word line may be precharged after the test data T_DATA is written to one or more of memory cells MC connected to the activated word line.

As described above and similar to the embodiment of FIG. 4, in the test mode, the test data T_DATA may be written to the memory cells MC connected to the word line refreshed by the target refresh operation.

After completion of all the operations, the memory controller 620 may read all the data of the memory cells MC connected to the plurality of word lines WL0 to WLN of the memory 600. It may be verified whether or not the test data T_DATA is written properly by checking the read data. It may be also checked whether or not the target refresh operation is performed properly and which word line is the high-activated word line.

For easy check of the test data T_DATA, the memory controller 620 in the test mode may write the comparison data C_DATA different from the test data T_DATA to the memory cells MC connected to the plurality of word lines WL0 to WLN of the memory 600 before the target refresh operation after detection of the high-activated word line. It may be verified whether or not the target refresh operation is performed properly and which word line is the high-activated word line when whole data in the memory 600 is read after completion of the test by the above mentioned operation.

The memory 600 may input to the memory controller 620 the target refresh signal TRR_EN. For example, the test data T_DATA may comprise bits that are all logic HIGH or logic LOW and the comparison data C_DATA may comprise bits of inverse value of the test data T_DATA.

Set forth below is the description of a memory in accordance to an embodiment with reference to FIGS. 4 to 7.

The memory may include the plurality of word lines WL0 to WLN to which one or more of memory cells MC are connected and a control unit activating and precharging the plurality of word lines WL0 to WLN sequentially during the refresh operation and a word line selected through an address of the high-activated word line during the target refresh operation. The control unit in the test mode writes the test data to one or more of memory cells MC connected to the word line that is selected based on the address of the high-activated word line during the target refresh operation.

The control unit of the memory 400 shown in FIG. 4 may include the refresh control unit 406, the address counting unit 407, the high-activation detection unit 408, the address storage unit 409, the row control unit 410, and the column control unit 411.

The control unit of the memory 600 shown in FIG. 6 may include the refresh control unit 606, the address counting unit 607, the row control unit 608, the column control unit 609, the cell array 610, the precharge command transferring unit 611, and the precharge signal generating unit 612.

The memory, during the target refresh operation, may refresh one or more of the adjacent word lines adjacent to the high-activated word line and, in the test mode, may write the test data T_DATA to the memory cell MC connected to one or more of the adjacent word lines. The memory during the target refresh operation in the test mode may precharge one or more of the adjacent word lines after completion of writing the test data T_DATA to the memory cell MC connected to one or more of the adjacent word lines.

Before writing the test data T_DATA to the memory cell MC connected to one or more of the adjacent word lines, the memory may write the comparison data C_DATA different from the test data T_DATA to one or more of the memory cells MC connected to the plurality of word lines WL0 to WLN. After completion of writing the test data T_DATA to the memory cell MC connected to one or more of the adjacent word lines, all of data written to one or more of the memory cells MC connected to the plurality of word lines WL0 to WLN may be read.

Figure 8:
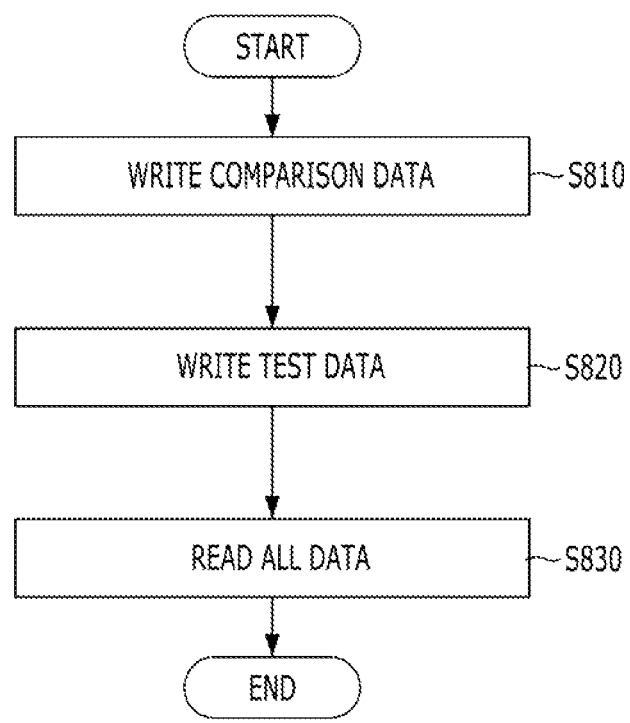
FIG. 8 is a flow chart illustrating a method for operating a memory in accordance with an embodiment of the present invention.

FIG. 8 is a flow chart illustrating a method for operating a memory in accordance with an embodiment of the present invention.

Referring to FIG. 8, the method may include step S810 of writing the comparison data, step S820 of writing the test data and step S830 of reading the comparison and test data.

The step S810 may be performed after detection of the high-activated word line in the test mode. In the step S810 of writing the comparison data, the memory may write the comparison data C_DATA to all of the memory cells MC connected to the plurality of word lines WL0 to WLN of the memory.

In the step S820 of writing the test data after the step S810, the memory may activate the adjacent word line adjacent to the high-activated word line for the target refresh operation. The memory may write the test data T_DATA to the memory cells MC connected to the adjacent word line while keeping the adjacent word line activated without precharging the activated adjacent word line, which is different from normal refresh operation. The memory in the step S820 may precharge the activated adjacent word line after completion of writing the test data T_DATA.

In the step S830 of reading the comparison and test data, the memory may read all of data written to one or more of the memory cells MC connected to the plurality of word lines WL0 to WLN. As described above, it may be verified whether or not the target refresh operation to the specific word line is performed properly and which word line is the high-activated word line by reading all of data written to one or more of the memory cells MC connected to the plurality of word lines WL0 to WLN.

For reference, commands with notation of 'ACT', 'PRE'. 'WT', 'RD', 'WP', 'RD', 'SET' and so forth are external commands represented by the combination of the input commands CMDs from the memory controller and commands with notation of 'iACT', 'iPRE'. 'iWT', 'iRD', 'iWP', 'iRD', 'iSET' and so forth are internal commands activated by the command decoder in response to the combination of input commands CMDs.

Although various embodiments have been described for illustrative purposes, it will be apparent to those skilled in the art that various changes and modifications may be made without departing from the spirit and scope of the invention as defined in the following claims.

What is claimed is:

1. A memory comprising:
a plurality of word lines to which one or more memory cells are connected; and
a control unit suitable for activating and precharging a first word line that is selected based on an address of a high-activated word line during a target refresh operation while sequentially activating and precharging the plurality of word lines in a refresh operation, wherein the control unit is suitable for writing a test data to one or more first memory cells connected to the first word line during the target refresh operation in a test mode,
wherein the high-activated word line is a word line activated over a reference number or a reference frequency, among the plurality of word lines.

2. The memory of claim 1, wherein the first word line includes one or more word lines adjacent to the high-activated word line.

3. The memory of claim 1, wherein the control unit writes a comparison data, which is different from the test data, to the memory cells connected to the plurality of word lines before writing the test data to the first memory cells during the target refresh operation in the test mode.

4. The memory of claim 1, wherein the control unit reads data written to the memory cells that are connected to the plurality of word lines after writing the test data to the first memory cells during the target refresh operation in the test mode.

5. The memory of claim 1, further comprising:
a high-activation detection unit suitable for detecting the address of the high-activated word line with reference to an activation history of the plurality of the word lines.

6. The memory of claim 1, further comprising:
an address counting unit suitable for performing counting operations more than one time in the every refresh operation and generating a counting address for selecting one of the plurality of word lines during the refresh operation.

7. The memory of claim 1, wherein the control unit activates the first word line during the target refresh operation, in the test mode, and
wherein the control unit precharges the first word line after the control unit writes the test data to the one or more first memory cells that are connected to the first word line, in the test mode.

8. A memory system comprising:
a memory controller suitable for generating a refresh command with a set interval, and additionally generating write and precharge commands and test data with the refresh command in a test mode; and
a memory including a plurality of word lines to which one or more memory cells are connected and suitable for activating and precharging an adjacent word line that is adjacent to a high-activated word line during a target refresh operation while sequentially activating and precharging the plurality of word lines in response to the refresh command, wherein the memory is suitable for writing the test data to one or more first memory cells connected to the adjacent word line during the target refresh operation in the test mode, wherein the high-activated word line is a word line activated over a reference number or a reference frequency, among the plurality of word lines.

9. The memory system of claim 8, wherein the memory activates the adjacent word line in response to the refresh command, writes the test data to one or more first memory cells in response to the write command, and precharges the activated adjacent word line in response to the precharge command, during the target refresh operation in the test mode.

10. The memory system of claim 8, wherein the memory includes:
- a high-activation detection unit suitable for detecting the high-activated word line based on an activation history of the plurality of the word lines;
- an address counting unit suitable for performing counting operations more than one time in the refresh operation and generating a counting address for selecting one of the plurality of word lines during the refresh operation;
- a refresh control unit suitable for activating a refresh active signal and a refresh precharge signal in response to the refresh command; and
- a row control unit suitable for activating the plurality of word lines in response to the refresh active signal and precharging the activated word line in response to the refresh precharge signal,
- wherein the refresh control unit activates the refresh active signal without generating the refresh precharge signal during the target refresh operation in the test mode.

11. The memory system of claim 8, wherein the memory controller inputs a comparison data, which is different from the test data, to the memory before the memory performs the target refresh operation in the test mode, and
- wherein the memory writes the comparison data to the memory cells connected to the plurality of word lines before the memory performs the target refresh operation in the test mode.

12. The memory system of claim 8, wherein the memory controller inputs the test data with the write command to the memory when the memory performs the target refresh operation in the test mode.

13. The memory system of claim 8, wherein the memory controller reads data written to the memory cells that are connected to the plurality of word lines from the memory after the memory performs the target refresh operation in the test mode.

14. A memory system comprising,
- a memory controller suitable for generating an active command and a precharge command sequentially during a target refresh operation, and generating the active command, the precharge command and a write and precharge command sequentially in the test mode; and
- a memory including a plurality of word lines to which one or more memory cells are connected and suitable for activating and precharging an adjacent word line that is adjacent to a high-activated word line in response to the active command and the precharge command during the target refresh operation, wherein the memory is suitable for writing a test data to a first memory cell connected to the adjacent word line in response to the active command and the write and precharge command during the target refresh operation in a test mode, wherein the high-activated word line is a word line activated over a reference number or a reference frequency, among the plurality of word lines.

15. The memory system of claim 14, wherein the memory activates the adjacent word line in response to the active command, blocks the precharge command, and writes the test data to first memory cells and precharges the activated adjacent word line in response to the write and precharge command, during the target refresh operation in the test mode.

16. The memory system of claim 14, wherein the memory controller detects the high-activated word line based on an activation history of the plurality of the word lines and inputs to the memory an address for selecting the adjacent word line during the target refresh operation.

17. The memory system of claim 14, wherein the memory includes:
- a precharge command transferring unit suitable for blocking the precharge command during the target refresh operation in the test mode;
- a precharge signal generating unit suitable for activating an auto precharge signal in response to the write and precharge command; and
- a row control unit suitable for activating the plurality of word lines in response to the active command and precharging the activated word line in response to the precharge command or the auto precharge signal.

18. A method for operating a memory including a plurality of word lines to which one or more memory cells are connected, the method comprising:
- setting a mode of the memory to a test mode;
- detecting a high-activated word line, which is activated over a reference number or reference frequency, among the plurality of word lines to perform a target refresh operation;
- writing a test data to an adjacent word line that is adjacent to the high-activated word line during a target refresh operation; and
- reading data written to the memory cells that are connected to the plurality of word lines.

19. The method of claim 18, wherein the writing of the test data includes:
- activating the adjacent word line for the target refresh operation; and
- applying the test data to one or more memory cells that are connected to the adjacent word line while blocking precharging the adjacent word line for the target refresh operation.

20. The method of claim 19, wherein the writing of the test data further includes precharging the adjacent word line applied with test data.

21. The method of claim 18, further comprising:
- writing a comparison data, which is different from the test data, to the memory cells that are connected to the plurality of word lines before the target refresh operation when the mode of the memory is set to the test mode.

* * * * *